United States Patent
Kwak et al.

(10) Patent No.: US 6,337,822 B1
(45) Date of Patent: Jan. 8, 2002

(54) WRITE MASKING IN A SEMICONDUCTOR MEMORY DEVICE

(75) Inventors: Jin-seok Kwak, Suwon; Yong-ho Shim, Yongin, both of (KR)

(73) Assignee: Samsung Electronics Co., Ltd., Kyungki-do (JP)

(*) Notice: Subject to any disclaimer, the term of this patent is extended or adjusted under 35 U.S.C. 154(b) by 81 days.

(21) Appl. No.: 09/604,585

(22) Filed: Jun. 27, 2000

(30) Foreign Application Priority Data

Jun. 25, 1999 (KR) .......................................... 99-24299

(51) Int. Cl.[7] ................................................ G11C 7/00
(52) U.S. Cl. ..................................................... 365/203
(58) Field of Search ........................... 365/203, 189.05, 365/230.06

(56) References Cited

U.S. PATENT DOCUMENTS 5,594,704 A * 1/1997 Konishi et al. ............. 365/233

* cited by examiner

Primary Examiner—Trong Phan
(74) Attorney, Agent, or Firm—Skjerven Morrill MacPherson LLP; David W. Heid

(57) ABSTRACT

A semiconductor memory device having a write masking function and a write masking method are provided. The semiconductor memory device includes a plurality of write bit lines, a plurality of write word lines, a plurality of write drivers, a plurality of MOS transistors, a plurality of latch circuits, and a plurality of precharge controllers. Each of the write drivers receives input data, a write enable signal and a write masking signal, outputs the input data when the write enable signal is activated and the write masking signal is deactivated, and does not output the input data when the write masking signal is activated. Each of the latch circuits includes an inverter having a large driving capacity and an inverter having a small driving capacity. When a precharge signal is activated, each of the precharge controllers precharges a corresponding write bit line to the logic threshold voltage of the inverter having the large driving capacity. Accordingly, memory cells are reliably masked in a write masking mode.

6 Claims, 6 Drawing Sheets

WRITE MASKING IN A SEMICONDUCTOR MEMORY DEVICE

BACKGROUND OF THE INVENTION

1. Field of the Invention

The present invention relates to semiconductor memory devices and write masking methods, and more particularly, to a static random access memory (RAM) that reliably performs a write masking function.

2. Description of the Related Art

A static random access memory cell may be implemented using an inverter having a large driving capacity and an inverter having a small driving capacity connected to form a latch. A write bit line for writing data to the memory cell connects through a first pass transistor to the input terminal of inverter having the large driving capacity, and a read bit line for reading data from the memory cell connects through a second pass transistor to the output terminal of inverter having the large driving capacity. Each of the write bit line and the read bit line requires a single line. In an array, each row of memory cells has the gates of the first pass transistors connected to a single write word line and the gates of the second pass transistors connected to a single read word line. When a write word line is activated, the memory cells in the corresponding row are simultaneously connected to the respective write bit lines, which enables storage of values from the write bit lines in the memory cells. Accordingly, writing data to a single memory cell in a row requires write masking. Otherwise, undefined or incorrect data are written to the other memory cells in the same row.

SUMMARY OF THE INVENTION

One embodiment of the present invention provides a semiconductor memory device that reliably performs write masking. Another embodiment of the present invention provides a write masking method suitable for a semiconductor memory device.

In an exemplary embodiment of the present invention, a semiconductor memory device includes: a plurality of write bit lines, a plurality of write word lines, a plurality of write drivers, a plurality of MOS transistors, a plurality of latch circuits, and a plurality of precharge controllers.

Each of the write drivers is connected to one of the write bit lines, receives input data, a write enable signal and a write masking signal, outputs the input data when the write enable signal is activated and the write masking signal is deactivated, and does not output the input data when the write masking signal is activated.

Each of the MOS transistors is connected to between one of the latch circuits and one of the write bit lines and is gated by a signal applied to an associated one of the write word lines.

The plurality of latch circuits together with the plurality of MOS transistors form a plurality of memory cells. Each of the latch circuits includes a first inverter and a second inverter and is connected to one of the MOS transistors. The first inverter has a driving capacity larger than that of the second inverter.

Each of the precharge controllers is connected to one of the write bit lines, receives a precharge signal, and precharges the write bit line to the logic threshold voltage of the first inverter when the precharge signal is activated.

The present invention also provides a semiconductor memory device including a plurality of write bit lines; a plurality of write word lines; a plurality of write drivers; a plurality of first MOS transistors; a plurality of latch circuits; a plurality of precharge controllers; a plurality of read word lines; a plurality of second MOS transistors; and a plurality of output buffers. Each of the write drivers is connected to one of the write bit lines, receives input data, a write enable signal and a write masking signal, outputs the input data when the write enable signal is activated and the write masking signal is deactivated, and does not output the input data when the write masking signal is activated. Each of the first MOS transistors is connected between one of the latch circuits and one of the write bit lines and is gated by a signal applied to an associated one of the write word lines. Each of the latch circuits is connected to one of the first MOS transistors and one of the second MOS transistors, and the latch circuits together with the first and second MOS transistors constitute a plurality of memory cells. Each of the latch circuits includes first and second inverters, the first inverter having a larger driving capacity than does the second inverter. Each of the precharge controllers is connected to an associated one of the write bit lines, receives a precharge signal, and precharges the associated write bit line to the logic threshold voltage of the first inverter when the precharge signal is activated. Each of the second MOS transistors is connected between one of the latch circuits and one of the read bit lines and is gated by a signal applied to an associated one of the read word lines. Each of the output buffers is connected to one of the read bit lines and buffers data on the read bit line.

A write masking method in accordance with and embodiment of the invention operates on a semiconductor memory device including a plurality of write bit lines, a plurality of read bit lines, and a plurality of latch circuits. Each of the latch circuits stores data input via one of the write bit lines and outputs the stored data via one of the read bit lines. Each of the latch circuits includes a first inverter having a large driving capacity, and a second inverter having a small driving capacity. The output and input terminals of the first inverter are respectively connected to the input and output terminals of the second inverter. The first inverter inverts the input data. The write masking method includes: precharging the write bit lines to the logic threshold voltage of the first inverters for a predetermined time, electrically connecting a selected write bit line to the input terminal of one of the first inverters, and driving the selected write bit line at the input voltage level of the selected first inverter.

In the semiconductor memory device according to the present invention, memory cells are reliably masked in a write masking mode.

BRIEF DESCRIPTION OF THE DRAWINGS

The features and advantages of the present invention will become more apparent by describing in detail preferred embodiments thereof with reference to the attached drawings in which.

The same reference numerals in different drawings represent the same or similar elements.

DETAILED DESCRIPTION OF THE INVENTION

The present invention now will be described in more detail with reference to the accompanying drawings, which show exemplary embodiments of the invention.

Figure 1:
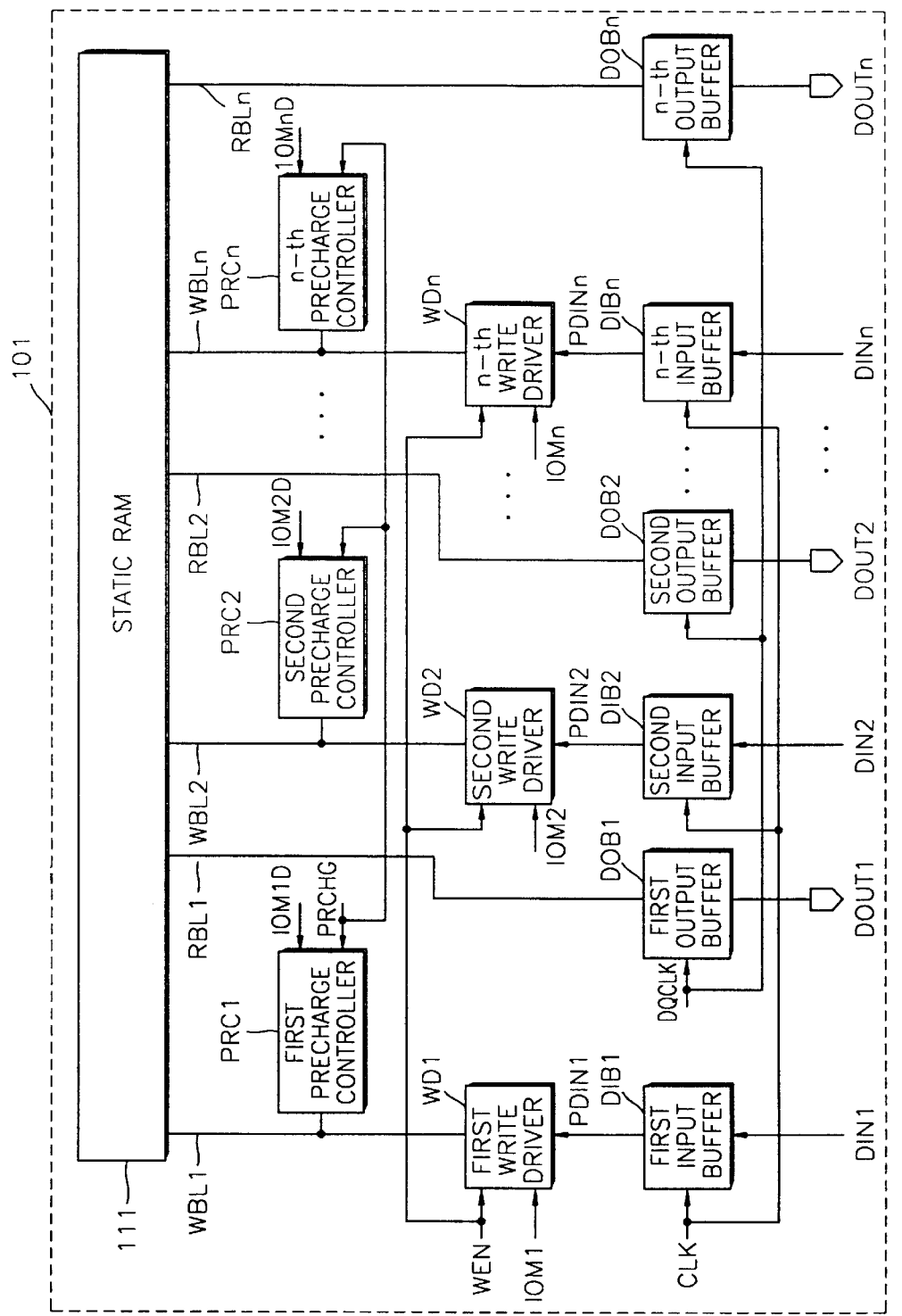
FIG. 1 is a block diagram of a semiconductor memory device according to an embodiment of the present invention.

FIG. 1 shows a semiconductor memory device 101 according to an exemplary embodiment of the present invention. Memory device 101 includes first through n-th input buffers DIB1–DIBn, first through n-th write drivers WD1–WDn, first through n-th precharge controllers PRC1–PRCn, first through n-th output buffers DOB1–DOBn, and a static random access memory (RAM) 111. The first through n-th input buffers DIB1–DIBn operate in synchronization with a clock signal CLK and convert input data signals DIN1–DINn to internal data signals PDIN1–PDINn having voltage levels suitable for the static RAM 111. The first through n-th output buffers DOB1–DOBn operate in synchronization with a clock signal DQCLK and convert data signals output from the static RAM 111 to output data signals DOUT1–DOUTn having voltage levels suitable for an external system (not shown).

Figure 2:
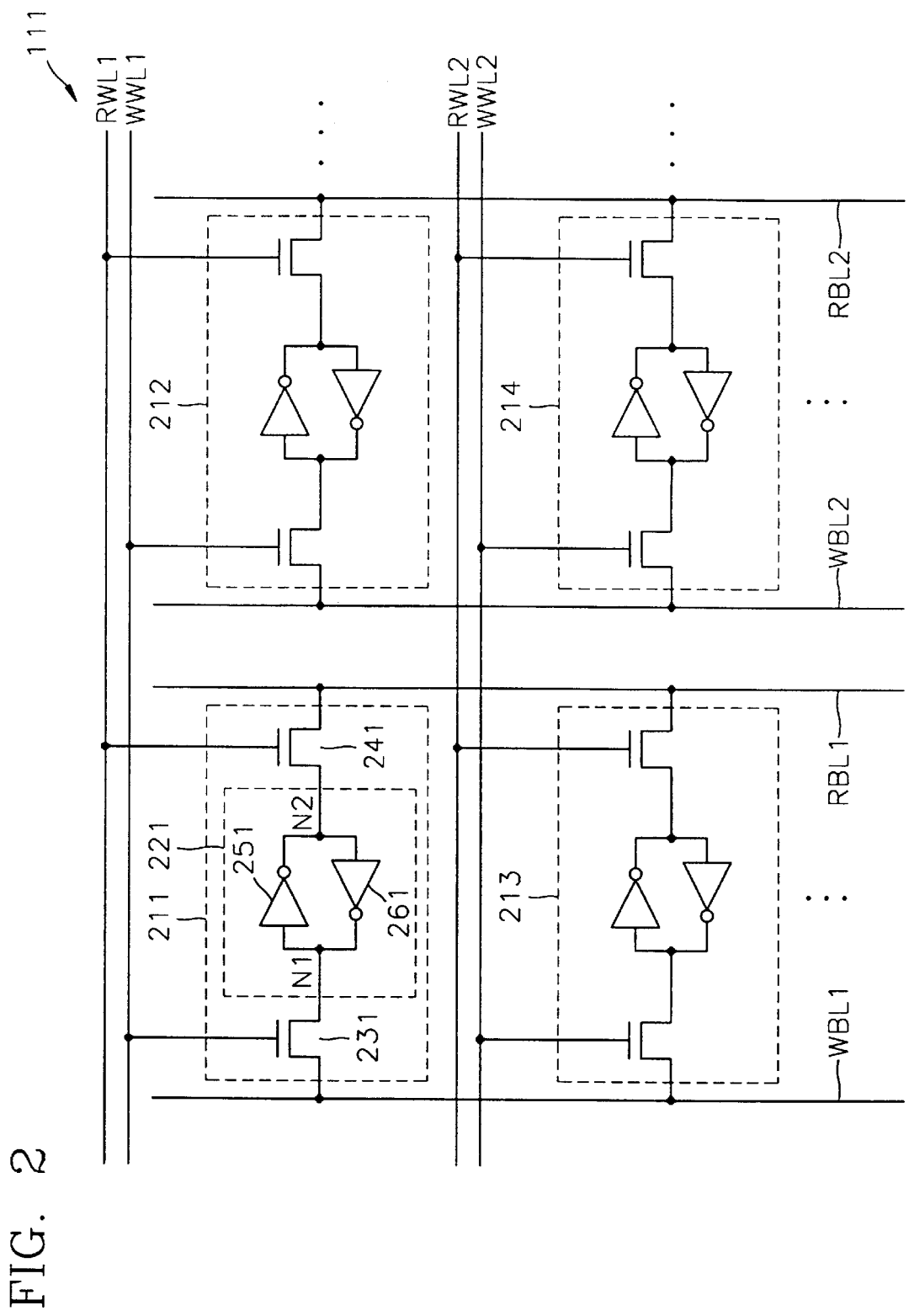
FIG. 2 is a circuit diagram of a portion of the static random access memory (RAM) of FIG. 1.

The static RAM 111 stores data. FIG. 2 shows a portion of the static RAM 111. The illustrated portion includes memory cells 211, 212, 213, and 214, read word lines RWL 1 and RWL2, write word lines WWL1 and WWL2, read bit lines RBL1 and RBL2, and write bit lines WBL1 and WBL2. In the semiconductor memory device 101, the memory cells 211, 212, 213, 214, and those not illustrate in FIG. 2 have the same structure and operate in the same manner, and thus description will focus on one memory cell 211 to avoid repetition.

The memory cell 211 includes a latch circuit 221 and NMOS transistors 231 and 241. The gate of the NMOS transistor 231 is connected to the write word line WWL1, and the drain of the NMOS transistor 231 is connected to the write bit line WBL1. Accordingly, the NMOS transistor 231 turns on when the write word line WWL1 is activated to a voltage level higher than the threshold voltage of the NMOS transistor 231, and turns off when the write word line WWL1 is deactivated to a voltage level lower than the threshold voltage of the NMOS transistor 231. The latch circuit 221 has a write node N1 connected to the NMOS transistor 231 and includes inverters 251 and 261. The inverter 251 has a driving capacity larger than that of the inverter 261. The output and input terminals of the inverter 251 are respectively connected to the input and output terminals of the inverter 261. The latch circuit 221 stores data signals input via the NMOS transistor 231 and increases the voltage transfer characteristic of the stored data signal at a read node N2. The latch circuit 221 also inverts the data input. The NMOS transistor 241 is connected to the read node N2 in the latch circuit 221, the read bit line RBL1 and the read word line RWL1. The NMOS transistor 241 turns on and transmits the data stored in the latch circuit 221 to the read bit line RBL1 when the read word line RWL1 is activated to a voltage level higher than the threshold voltage of the NMOS transistor 241. The NMOS transistor 241 turns off and interrupts transmission of data from the latch circuit 221 to the read bit line RBL1 when the read word line RWL1 is deactivated to a voltage level lower than the threshold voltage of the NMOS transistor 241. A plurality of memory cells, for example, 6 or more memory cells, are connected to each of the write bit line WBL1–WBLn and each of the read bit lines RBL1–RBLn.

Returning to FIG. 1, the first through n-th write drivers WD1–WDn receive a write enable signal WEN, respective write masking signals IOM1–IOMn, and respective internal data signals PDIN1–PDINn, and invert the data signals PDIN1–PDINn under the control of the write enable signal WEN and the write masking signals IOM1–IOMn. The first through n-th write drivers WD1–WDn increase the driving capability of the respective data signals PDIN1–PDINn, before forwarding the data signals PDIN1–PDINn to the write bit lines WBL1–WBLn so that the data signals PDIN1–PDINn can be stably written to the memory cells in the static RAM array 111. The first through n-th write drivers WD1–WDn have the same structure and operate the same, and thus to avoid repetition, only the first write driver WD1 is described.

Figure 3:
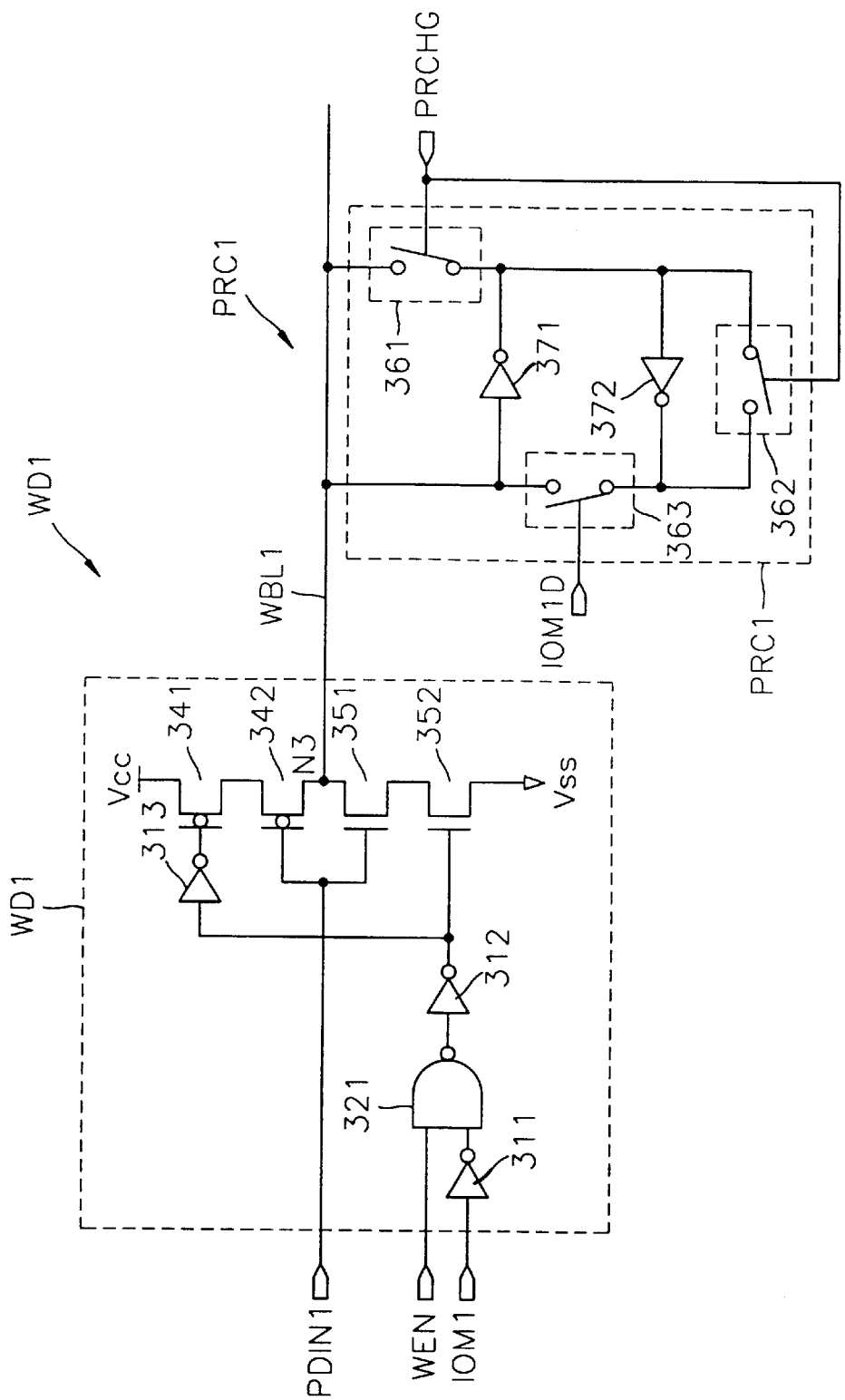
FIG. 3 is a circuit diagram of the first write driver and the first precharge controller of FIG.1.

FIG. 3 illustrates an embodiment of the first write driver WD1 and the first precharge circuit PRC1, which connect to the first write bit line WBL 1. The first write driver WD1 includes inverters 311, 312, and 313, a NAND gate 321, PMOS transistors 341 and 342, and NMOS transistors 351 and 352. The inverter 311 inverts the write masking signal IOM1. The NAND gate 321 performs a NAND operation on the output signal of the inverter 311 and the write enable signal WEN. The inverter 312 inverts the output signal of the NAND gate 321, and the inverter 313 inverts the output signal of the inverter 312. The PMOS transistors 341 and 342 and the NMOS transistors 351 and 352 are connected in series between a supply voltage Vcc and a ground voltage Vss and collectively function as a tri-state inverter. When the output signal of the inverter 312 is at a logic high level, the PMOS transistor 341 and the NMOS transistor 352 are on, and the write driver WD1 inverts the data signal PDIN1 in generating an output signal to a node N3. When the output signal of the inverter 312 is at a logic low level, the PMOS transistor 341 and the NMOS transistor 352 are off, and the first write driver WD1 does not transmit the data signal PDIN1 to the node N3. Consequently, the first write driver WD1 inverts the data signal PDIN1 to produce an output signal when the write enable signal WEN is activated to a logic high level and the write masking signal IOM1 is deactivated to a logic low level. When the write masking signal IOM1 is activated to a logic high, the first write driver WD1 does not transmit the data PDIN1 to the node N3 regardless of a logic state of the write enable signal WEN.

The first through n-th precharge controllers PRC1–PRCn are connected to the respective write bit lines WBL1–WBLn and receive a precharge signal PRCHG and respective write masking control signals IOM1D–IOMnD. The effective circuit configuration of the first through n-th precharge controllers PRC1–PRCn changes to the configuration of FIG. 4A or the configuration of FIG. 4B depending on the activation of the precharge signal PRCHG and the activation of the respective write masking control signals IOM1D–IOMnD. The first through n-th precharge controllers PRC1–PRCn have the same structure and operation, and thus only the first precharge controller PRC1 will be described.

Referring to FIG. 3, the first precharge controller PRC1 includes inverters 371 and 372 and switches 361, 362, and 363. The switches 361 and 362 turn on when the precharge signal PRCHG goes to a logic high level and turn off when the precharge signal PRCHG goes to a logic low level. The switch 363 turns on when the write masking control signal IOM1D goes to a logic high level and turns off when the write masking control signal IOM1D goes to a logic low level. When the precharge signal PRCHG goes to a logic high level and the write masking control signal IOM1D goes to a logic low, the first precharge controller PRC1 has the effective circuit configuration shown in FIG. 4A. When the precharge signal PRCHG goes to a logic low level and the write masking control signal IOM1D goes to a logic high level, the first precharge controller PRC1 has the effective circuit configuration shown in FIG. 4B.

Figure 4A:
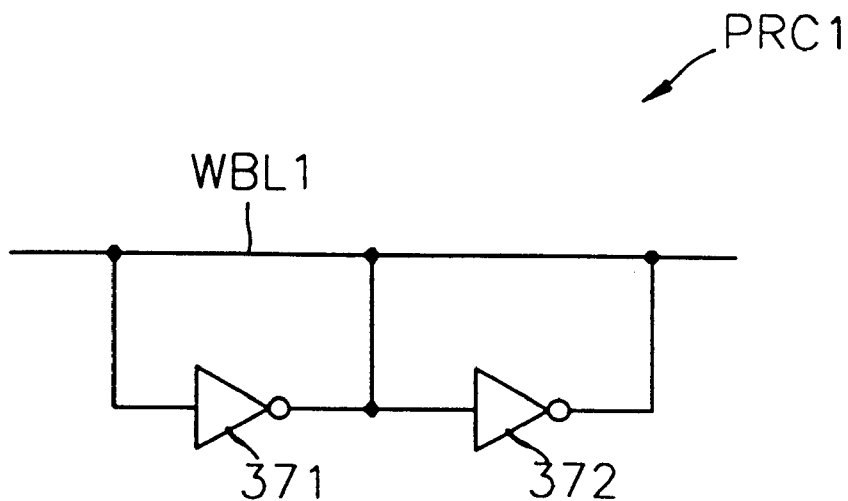
FIG. 4A is an equivalent circuit diagram of the first precharge controller when the precharge signal is activated and the write masking control signal is deactivated in FIG. 3.

When the first precharge controller PRC1 has the configuration of FIG. 4A, the write bit line WBL1 is precharged to a predetermined voltage level. In this case, the inverters 371 and 372 have the same size, voltage transfer characteristics, and logic threshold voltage as the inverter 251 of FIG. 2. Accordingly, the inverters 371 and 372 charge the write bit line WBL1 to the logic threshold voltage of the inverter 251. The logic threshold voltage is the input voltage corresponding to a transition of an output signal from one logic state to the other. To increase drive capacity, each of the inverters 371 and 372 may be composed of a plurality of inverters having the same size. In this case, the write bit line WBL1 is powerfully precharged to the level of the logic threshold voltage of the inverter 251 having the large driving performance.

Figure 4B:
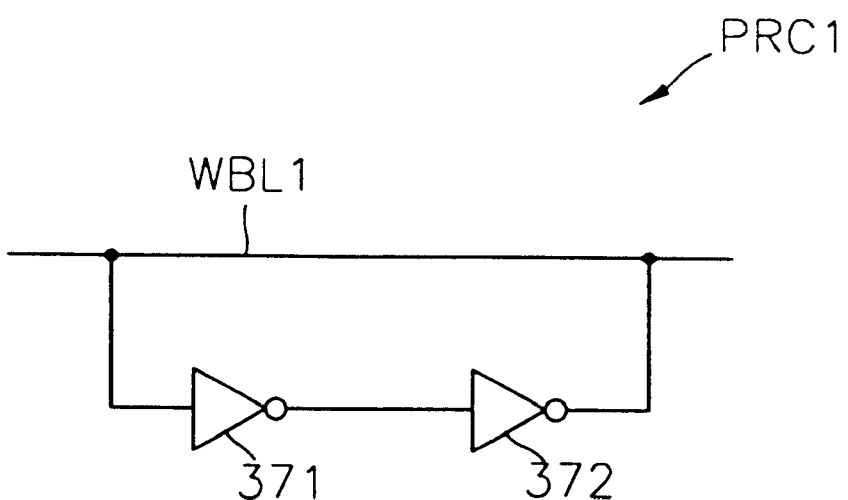
FIG. 4B is an equivalent circuit diagram of the first precharge controller when the precharge signal is deactivated and the write masking control signal is activated in FIG. 3.

When the first precharge controller PRC1 has the configuration as shown in FIG. 4B, the write bit line WBL1 is driven at a particular logic level. For example, when ground voltage Vss or power supply voltage Vcc is applied from the outside to the write bit line WBL1, which has been precharged to the logic threshold voltage of the inverter 251, the inverters 371 and 372 quickly charge the write bit line WBL1 to the level of the ground voltage Vss or the level of the power supply voltage Vcc.

Figure 5A:
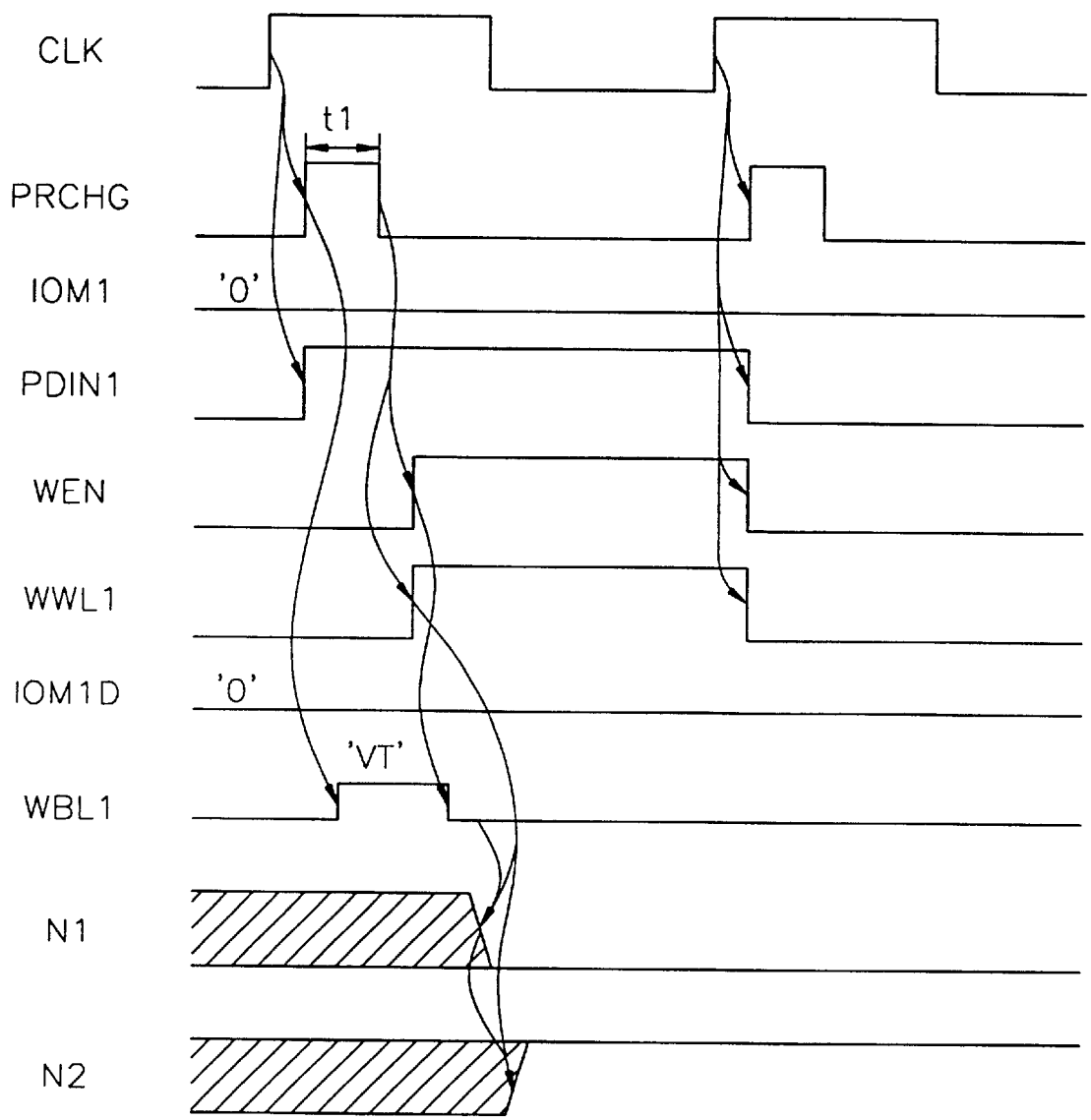
FIG. 5A is a timing diagram showing signals when writing to a memory cell in the semiconductor memory device of FIG. 1.

FIG. 5A is a timing diagram showing signals in the semiconductor memory device of FIG. 1 for a normal write mode operation on a memory cell. With reference to FIG. 5A, the operation of the circuits writes the data signal PDIN1 to the memory cell 211 of FIG. 2, which is connected to the write bit line WBL1.

When the semiconductor memory device 101 is in a normal write mode for the write bit line WBL1, the write masking signal IOM1 and the write masking control signal IOM1D maintain a deactivated state at a logic low level. Once the clock signal CLK transits from a first level to a second level, for example, from a logic low level to a logic high level, the precharge signal PRCHG is activated. Once the precharge signal PRCHG is activated, the first precharge controller PRC1 has the configuration as shown in FIG. 4A, and thus charges the write bit line WBL1 to the voltage level corresponding to the logic threshold voltage of the inverter 251 of FIG. 2. Also when the clock signal CLK transits from the first to the second level, the data signal PDIN1 is output from the first input buffer DIB1 and applied to the first write driver WD1. After a predetermined time t1, the precharge signal PRCHG is deactivated, and the write enable signal WEN and the write word line WWL1 are activated to a logic high level. When the write enable signal WEN goes to the logic high level, the output signal of the inverter 312 of FIG. 3 goes to a logic high level, and thus the data PDIN1 is inverted and appears as a logic low signal at the node N3. Alternately, if the data PDIN1 is a logic low level, a logic high level appears at the node N3. Since the node N3 is at the logic low level, the write bit line WBL1 goes from the precharged state to a logic low state, and the latch circuit 221 receives and stores the data signal PDIN1 via the NMOS transistor 231 of FIG. 2.

Figure 5B:
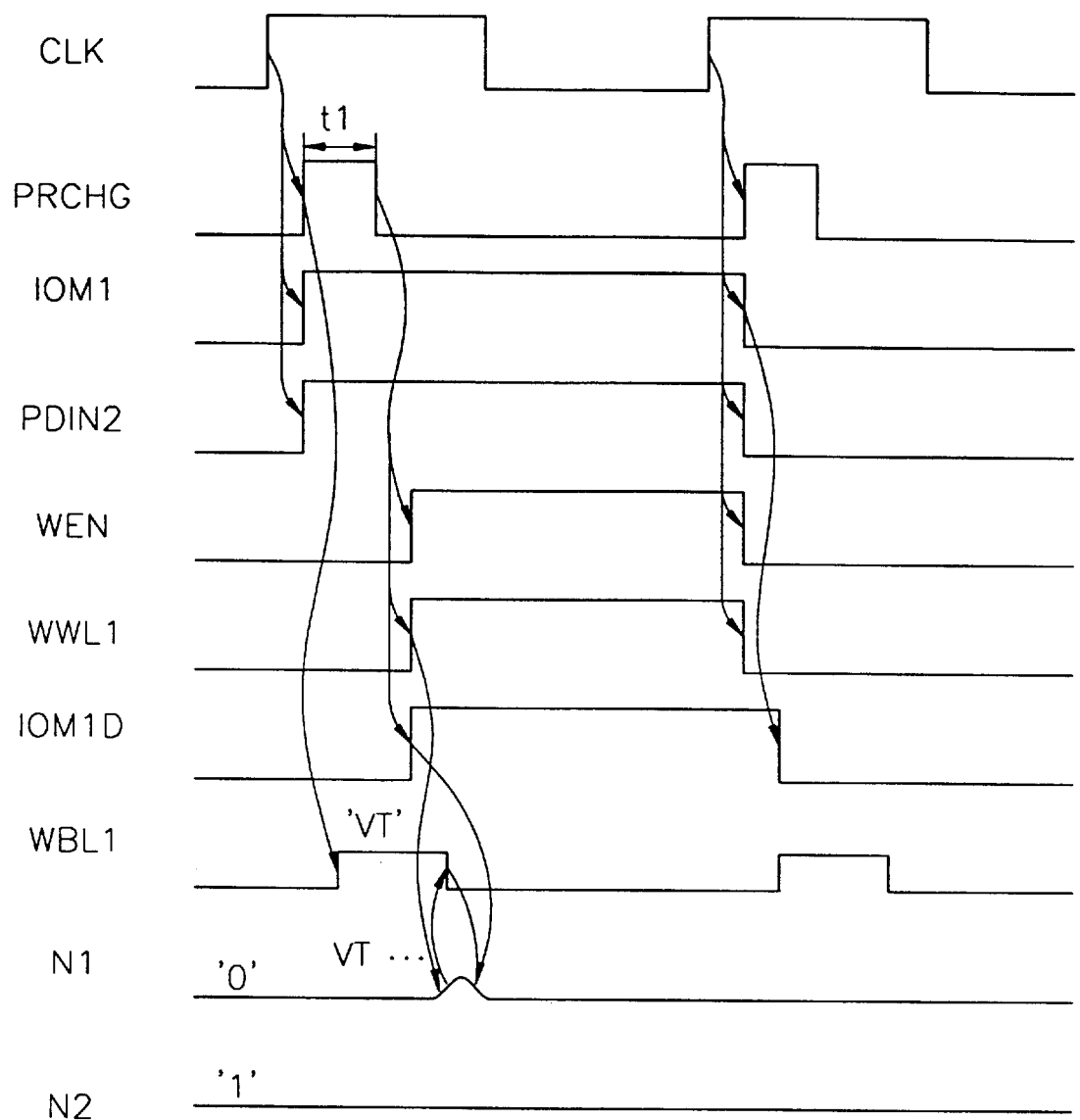
FIG. 5B is a timing diagram showing signals when masking a memory cell during a write to another memory cell in the semiconductor memory device of FIG. 1.

FIG. 5B is a timing diagram showing signals when the semiconductor memory device of FIG. 1 is in a write masking mode for the write bit line WB1. In particular, FIG. 5B illustrates the operation of the semiconductor memory device 101 for masking the memory cell 211 while writing to at least one other memory cell 212.

When the clock signal CLK transits from the first level to the second level, that is, from the logic low level to the logic high level, the precharge signal PRCHG is activated. The data PDIN2 is input to the second write driver WD2 via the second input buffer DIN2. The write masking signal IOM1 is activated to a logic high level. As the write masking signal IOM1 is activated, the output of the inverter 312 is a logic low level regardless of the write enable signal WEN. The PMOS transistor 341 and the NMOS transistor 352 of FIG. 3 remain off, and thus the write bit line WBL1 floats (i.e., is not driven by the first write driver WD1). The first precharge controller PRC1 precharges the otherwise floating write bit line WBL1 in responose to the precharge signal PRCHG being activated. Since the precharge signal PRCHG is activated and the write masking control signal IOM1D is initially at the deactivated logic low state, the first precharge controller PRC1 initially has the configuration as shown in FIG. 4A. Hence, the write bit line WBL1 is precharged to the logic threshold voltage of the inverter 251 of FIG. 2.

When the precharge signal PRCHG is deactivated after the predetermined time t1, the write enable signal WEN, the write word line WWL1, and the write masking control signal IOM1D are activated to a logic high level. Even if the write enable signal WEN goes to the logic high level, the write masking signal IOM1 remains in the activated state, and the write enable signal WEN does not influence the operation of the first write driver WD1. The write word line WWL1 is selected by an external address. When the write word line WWL1 is activated, the NMOS transistor 231 of FIG. 2 is on, and thus the latch circuit 221 is electrically connected to the write bit line WBL1. The voltage level of the input node N1 of the latch circuit 221 initially at the level associated with the stored data (e.g., the ground voltage Vss) gradually moves toward the level of the precharged voltage of the write bit line WBL1. Similarly, the voltage of the write bit line WBL1 changes according to the data stored in the latch circuit 221.

When the write masking control signal IOM1D is activated, the first precharge controller PRC1 takes the configuration of FIG. 4B and drives the write bit line WBL1 to one logic level or the other. In the case where node N1 is initially at the ground voltage Vss, the precharge circuit PRC1 drives the write bit line WBL1 from the precharged voltage level down to the level of the ground voltage Vss, and thus the level of the input node N1 of the latch circuit 221 of FIG. 2 rapidly returns to the level of the ground voltage Vss. On the other hand, when the level of the input node N1 of the latch circuit 221 is initially at the power supply voltage Vcc, the level of the input node N1 of the latch circuit 221 drops to near the level of the precharged voltage of the write bit line WBL1 and then rapidly returns to the level of the power supply voltage Vcc. Due to such operation, the input node N1 of the latch circuit 221 remains at an original logic level. In other words, the memory cell 211 is reliably masked, and the stored data value is unchanged. While the memory cell 211 is being masked, the data PDIN2 is written to the memory cell 212 in a normal operation mode.

As described above, the semiconductor memory device 101 includes the first through n-th precharge controllers PRC1–PRCn to precharge the write bit lines WBL1–WBLn to the same voltage level as that of the logic threshold voltage of the large-driving-capacity inverter 251 before writing the data PDIN1–PDINn to the memory cells, thereby reliably masking memory cells corresponding to activated write masking signals.

The drawings and specification illustrate exemplary embodiments of the invention, and although specific terms are employed, the terms and descriptions are used in a generic and descriptive sense only and not for purposes of limitation, the scope of the invention being set forth in the following claims. Various changes in form and details may be made in the disclosed embodiments without departing from the spirit and scope of the invention as defined by the appended claims.

What is claimed is:

1. A semiconductor memory device comprising:

a plurality of write bit lines;

a plurality of write word lines;

a plurality of write drivers, wherein each of the write drivers is connected to an associated one of the write bit lines, receives input data, a write enable signal and a write masking signal, outputs the input data when the write enable signal is activated and the write masking signal is deactivated, and does not output the input data when the write masking signal is activated;

a plurality of MOS transistors, wherein each of the MOS transistors is connected to an associated one of the write bit lines and to an associated one of the write word lines, and gated by a signal applied to the associated write word line;

a plurality of latch circuits respectively connected to the plurality of MOS transistors, wherein each of the latch circuits comprises a first inverter and a second inverter, the first inverter having a driving capacity that is larger than that the second inverter; and a plurality of precharge controllers, wherein each of the precharge controllers is connected to an associated one of the write bit lines, receives a precharge signal, and precharges the write bit line to a logic threshold voltage of the first inverter when the precharge signal is activated.

2. The semiconductor memory device of claim 1, wherein each of the precharge controllers receives a write masking control signal and enhances the precharged driving performance of the write bit line when the write masking control signal is activated.

3. A semiconductor memory device comprising:

a plurality of write bit lines;

a plurality of write word lines;

a plurality of write drivers, wherein each of the write drivers is connected to an associated one of the write bit lines, receives input data, a write enable signal and a write masking signal, outputs the input data when the write enable signal is activated and the write masking signal is deactivated, and does not output the input data when the write masking signal is activated;

a plurality of first MOS transistors, wherein each of the first MOS transistors is connected to an associated one of the write bit lines and to an associated one of the write word lines, and gated by a signal applied to the associated write word line;

a plurality of latch circuits respectively connected to the plurality of first MOS transistors, wherein each of the latch circuits comprises a first inverter and a second inverter, the first inverter having a driving capacity that is larger than that of the second inverter;

a plurality of precharge controllers, wherein each of the precharge controllers is connected to an associated one of the plurality of write bit lines, receives a precharge signal, and precharges the associated write bit line to a logic threshold voltage of the first inverter when the precharge signal is activated;

a plurality of read bit lines;

a plurality of read word lines;

a plurality of second MOS transistors, wherein each of the second MOS transistors is connected to an associated one of the read bit lines, an associated one of the read word lines and an associated one of the latch circuits, and is gated by a signal applied to the read word line; and a plurality of output buffers, wherein each of the output buffers is connected to an associated one of the read bit lines and buffers data on the associated read bit line.

4. The semiconductor memory device of claim 3, wherein each of the precharge controllers receives a write masking control signal and enhances the precharged driving performance of the write bit line when the write masking control signal is activated.

5. A write masking method in a semiconductor memory device comprising a plurality of write bit lines, a plurality of read bit lines and a plurality of latch circuits, wherein each of the latch circuits stores data input via an associated one of the write bit lines and outputs the stored data via an associated one of the read bit lines, wherein each of the latch circuits comprises a first inverter and a second inverter, the first inverter inverting input data and having a driving capacity larger than that of the second inverter, wherein output and input terminals of the first inverter are respectively connected to input and output terminals of the second inverter, the write masking method comprising:

precharging the plurality of write bit lines to a logic threshold voltage of the first inverters for a predetermined time;

electrically connecting a write bit line selected from the plurality of write bit lines to the input terminal of a selected one of the first inverters; and driving the selected write bit line at the input voltage level of the selected first inverter.

6. The method of claim 5, wherein driving the selected write bit line comprises connecting to the selected write bit line a circuit configured to drive the selected write line to a logic level associated with a voltage change caused by electrically connecting on the selected write bit line to the selected first inverter.

* * * * *